(12) United States Patent
Kato

(10) Patent No.: US 11,823,865 B2
(45) Date of Patent: Nov. 21, 2023

(54) PLASMA GENERATION APPARATUS, DEPOSITION APPARATUS USING THE SAME, AND DEPOSITION METHOD

(71) Applicant: Tokyo Electron Limited, Tokyo (JP)

(72) Inventor: Hitoshi Kato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/657,999

(22) Filed: Apr. 5, 2022

(65) Prior Publication Data

US 2022/0336190 A1    Oct. 20, 2022

(30) Foreign Application Priority Data

Apr. 14, 2021   (JP) .................................. 2021-068588

(51) Int. Cl.
| | |
|---|---|
| H01J 37/32 | (2006.01) |
| C23C 16/505 | (2006.01) |
| C23C 16/458 | (2006.01) |
| C23C 16/40 | (2006.01) |
| C23C 16/455 | (2006.01) |

(52) U.S. Cl.
CPC ...... H01J 37/3211 (2013.01); C23C 16/4584 (2013.01); C23C 16/505 (2013.01); H01J 37/32467 (2013.01); H01J 37/32522 (2013.01); *C23C 16/402* (2013.01); *C23C 16/45536* (2013.01); *H01J 2237/3321* (2013.01)

(58) Field of Classification Search
CPC ........ C23C 16/45519; C23C 16/45578; C23C 16/34; C23C 16/505; C23C 16/45551; C23C 16/4554; C23C 16/4584; C23C 16/509; C23C 16/45536; C23C 16/402; H01J 37/3211; H01J 37/32467; H01J 37/32522; H01J 2237/3321
See application file for complete search history.

(56) References Cited

U.S. PATENT DOCUMENTS

| | | | |
|---|---|---|---|
| 2006/0070703 A1* | 4/2006 | Johnson ............ | H01J 37/32623 216/60 |
| 2013/0087097 A1* | 4/2013 | Kato .................... | H01J 37/3211 118/719 |
| 2016/0276230 A1* | 9/2016 | Nagorny ............. | H01L 21/3065 |

FOREIGN PATENT DOCUMENTS

JP      2018-041685      3/2018

* cited by examiner

*Primary Examiner* — Yuechuan Yu
(74) *Attorney, Agent, or Firm* — IPUSA, PLLC

(57) ABSTRACT

A plasma generation apparatus includes a housing fitted in a portion of an upper surface of a process chamber of a deposition apparatus and having a protruding portion having an elongated shape in a plan view and protruding upward from a bottom surface, a coil wound around a side surface of the protruding portion and having an elongated shape in the plan view, and an inclination adjustment mechanism configured to independently move upward and downward both ends in a longitudinal direction of the coil to change an inclination of the coil in the longitudinal direction.

16 Claims, 7 Drawing Sheets

PLASMA GENERATION APPARATUS, DEPOSITION APPARATUS USING THE SAME, AND DEPOSITION METHOD

CROSS-REFERENCE TO RELATED APPLICATION

The present application is based on and claims priority to Japanese Priority Application No. 2021-068588 filed on Apr. 14, 2021, the entire content of which is hereby incorporated herein by reference.

BACKGROUND OF THE INVENTION

1. Field of the Invention

The present disclosure relates to a plasma generation apparatus, a deposition apparatus using the same, and a deposition method.

2. Description of the Related Art

For example, conventionally, Japanese Laid-Open Patent Application Publication No. 2018-41685 discloses a plasma generation apparatus and a plasma process apparatus capable of automatically changing the shape of an antenna. In such a plasma generation apparatus, multiple antenna members are connected with a connection member, and at least two antenna members are moved up and down so as to allow for changing the bending angle around the connection member as the fulcrum.

SUMMARY OF THE INVENTION

An embodiment of the present disclosure provides a plasma generation apparatus that includes a housing fitted in a portion of an upper surface of a process chamber of a deposition apparatus and having a protruding portion having an elongated shape in a plan view and protruding upward from a bottom surface, a coil wound around a side surface of the protruding portion and having an elongated shape in the plan view, and an inclination adjustment mechanism configured to independently move upward and downward both ends in a longitudinal direction of the coil to change an inclination of the coil in the longitudinal direction.

BRIEF DESCRIPTION OF THE DRAWINGS

FIG. 1 is a schematic vertical cross-sectional view illustrating a deposition apparatus according to a first embodiment of the present disclosure.

DETAILED DESCRIPTION OF THE PREFERRED EMBODIMENTS

It is desired to provide a plasma generation apparatus, a deposition apparatus using the same, and a deposition method capable of supporting a high-temperature process and adjusting an inclination of a coil.

Hereinafter, embodiments for carrying out the present invention will be described with reference to the drawings.

[Configuration of Deposition Apparatus According to First Embodiment]

Figure 1:
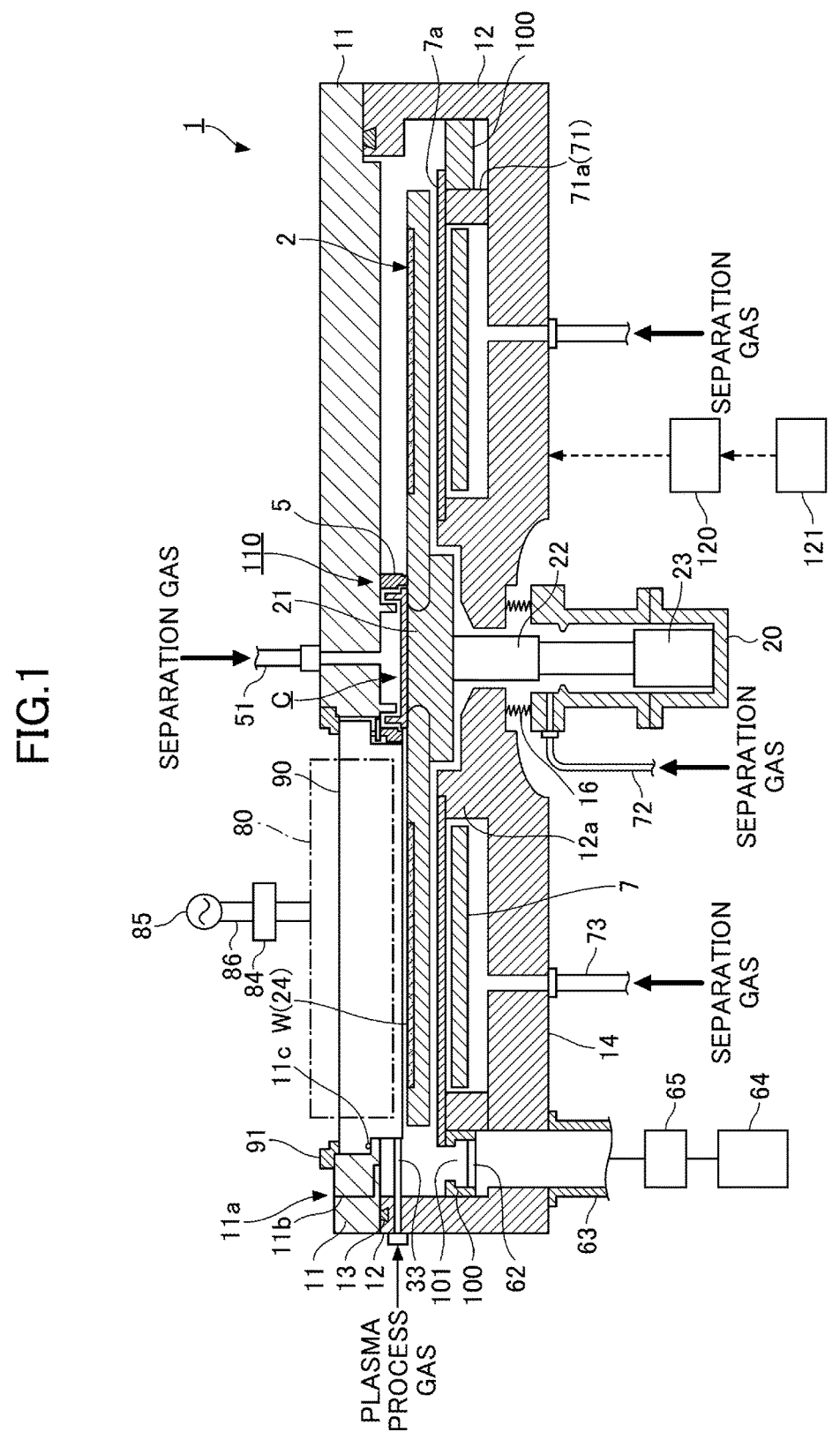
Figure 2:
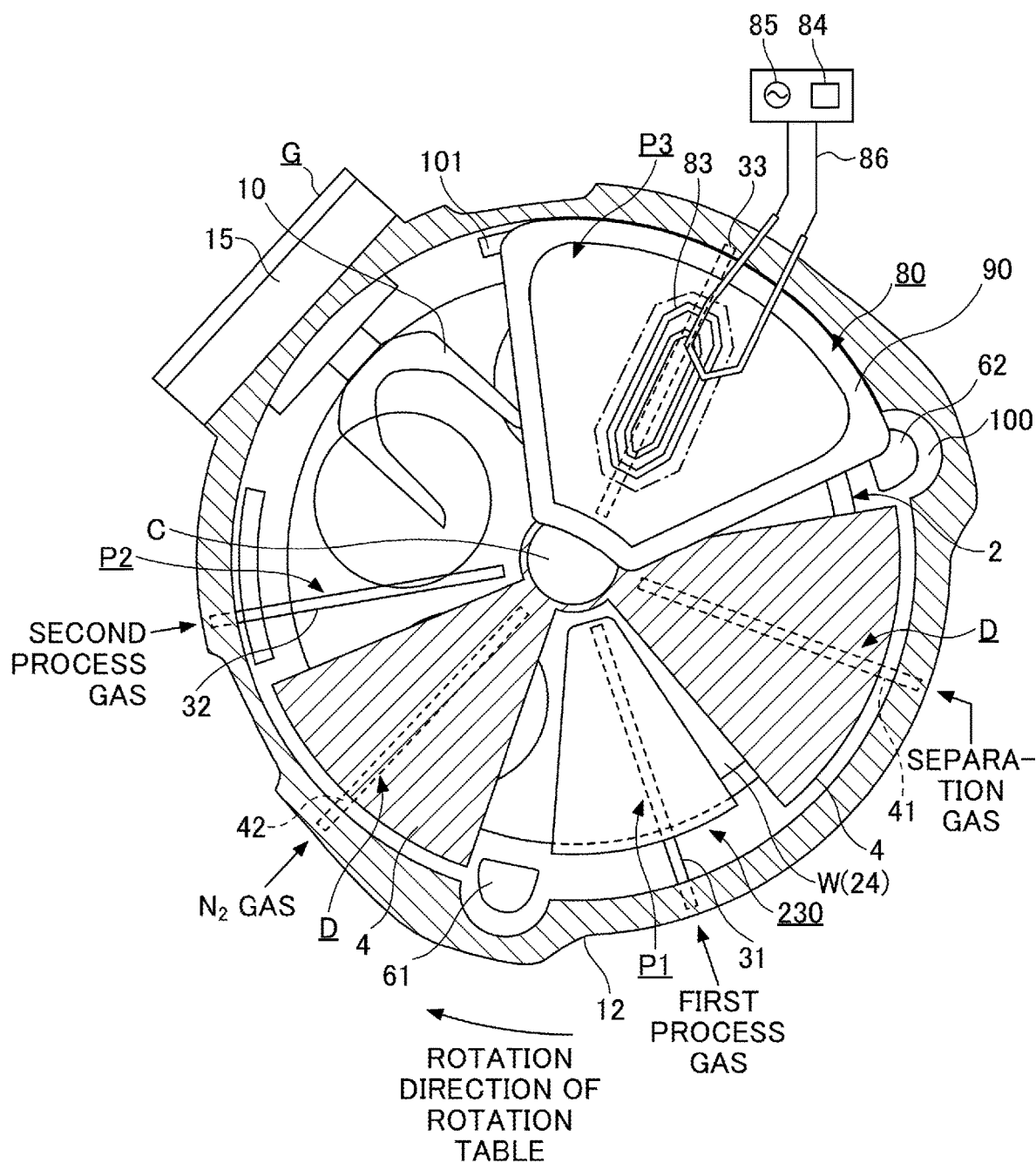
FIG. 2 is a schematic plan view illustrating an example of a deposition apparatus according to the first embodiment of the present disclosure.

FIG. 1 is a schematic vertical cross-sectional view illustrating a deposition apparatus according to a first embodiment of the present disclosure. FIG. 2 is a schematic plan view illustrating an example of a deposition apparatus according to the present embodiment. For the sake of convenience, in FIG. 2, a top panel 11 is not illustrated.

As illustrated in FIG. 1, the plasma process apparatus according to the present embodiment includes: a vacuum container 1 of which the planar shape is substantially a circular shape; and a rotation table 2 disposed in the vacuum container 1, the center of rotation of the rotation table 2 being at the center of the vacuum container 1, and the rotation table 2 being configured to cause a wafer W to revolve.

The vacuum container 1 is a process chamber configured to accommodate the wafer W and perform a plasma process on a film and the like formed on the surface of the wafer W. The vacuum container 1 includes: a top panel (ceiling portion) 11 disposed at a position facing a recessed portion 24, explained later, of the rotation table 2; and a container main body 12. In addition, the vacuum container 1 includes a seal member 13 in a ring-shape at the peripheral portion on the upper surface of the container main body 12. The top panel 11 is configured to be detachable from the container main body 12. A diameter size (an inner diameter size) of the vacuum container 1 in a plan view is not particularly limited, and may be, for example, about 1100 mm.

A separation gas supply tube 51 is connected to the central portion on the upper surface side in the vacuum container 1. The separation gas supply tube 51 supplies separation gas to inhibit mixing of different process gases in the central area C in the vacuum container 1.

The rotation table 2 is fixed to a core portion 21 in a substantially cylindrical shape in the central portion. The lower surface of the core portion 21 is connected to a shaft 22 extending in the vertical direction, so that the rotation table 2 can be rotated by a driving unit 23 about a vertical axis that coincides with the shaft 22 in a clockwise direction in the example as illustrated in FIG. 2. The diameter size of the rotation table 2 is not particularly limited, and is, for example, about 1000 mm.

The shaft 22 and the driving unit 23 are accommodated in a casing 20. A flange portion on the upper surface side of the casing 20 is hermetically attached to a lower surface of the bottom surface portion 14 of the vacuum container 1. Also, a purge gas supply tube 72 is connected to the casing 20 to supply nitrogen gas and the like as purge gas (separation gas) to a lower area of the rotation table 2.

On the outer circumferential side of the core portion 21, a protruding portion 12a in a ring-shape is formed on the bottom surface portion 14 of the vacuum container 1 such that the protruding portion 12a extends toward the rotation table 2 from the lower side thereof.

On a surface of the rotation table 2, recessed portions 24 are formed as substrate-receiving areas on which wafers W with a diameter size of, for example, 300 mm are placed. For example, multiple recessed portions 24, i.e., five recessed portions 24 are disposed along the rotation direction of the rotation table 2. The recessed portion 24 has an inner diameter slighter larger, specifically, by about 1 mm to 4 mm, than the diameter of the wafer W. The depth of the recessed portion 24 is configured to be substantially equal to the thickness of the wafer W or larger than the thickness of the wafer W. Therefore, when the wafer W is accommodated in the recessed portion 24, the surface of the wafer W and a surface of the rotation table 2 where the wafer W is not placed are of the same height, or the surface of the wafer W is lower than the surface of the rotation table 2. In a case where the depth of the recessed portion 24 is deeper than the thickness of the wafer W, if the depth of the recessed portion 24 is excessively deep, the deposition may be affected, and therefore, the depth of the recessed portion 24 is preferably up to about three times the thickness of the wafer W. In addition, through holes, not illustrated, are formed in the bottom surface of the recessed portion 24. For example, three lifting pins, explained later, configured to push and lift the wafer W from the lower side penetrate the through holes.

As illustrated in FIG. 2, along the rotation direction of the rotation table 2, a first process area P1, a second process area P2, and a third process area P3 are disposed to be spaced apart from one another. The third process area P3 may be a plasma process area, and accordingly, hereinafter the third process area P3 may also be denoted as a plasma process area P3. At positions in the vacuum container 1 above the recessed portions 24 of the rotation table 2, multiple gas nozzles, for example, five gas nozzles 31, 32, 33, 41, and 42, made of, for example, quartz, are disposed radially with intervals from one another in a circumferential direction of the vacuum container 1. These gas nozzles 31 to 33, 41, and 42 are provided between the rotation table 2 and the top panel 11. For example, the gas nozzles 31, 32, 41, and 42 are attached so as to face the wafer W and extend horizontally from the outer circumferential wall of the vacuum container 1 toward the central area C. In contrast, the gas nozzle 33 extends horizontally, bends upward, and then extends horizontally again, which is explained later. In the example as illustrated in FIG. 2, the plasma process gas nozzle 33, the separation gas nozzle 41, the first process gas nozzle 31, the separation gas nozzle 42, and the second process gas nozzle 32 are arranged in this order in the clockwise direction (the rotation direction of the rotation table 2) from a conveying port 15 explained later. The gas supplied from the second process gas nozzle 32 is often a gas having the same property as the gas supplied from the plasma process gas nozzle 33, but if the supply of the gas from the plasma process gas nozzle 33 is sufficient, the gas supplied from the second process gas nozzle 32 does not have to be necessarily provided.

The first process gas nozzle 31 constitutes a first process gas supply unit. The second process gas nozzle 32 constitutes a second process gas supply unit. The plasma process gas nozzle 33 constitutes a plasma process gas supply unit. The separation gas nozzles 41 and 42 constitute separation gas supply units.

The nozzles 31 to 33, 41, and 42 are connected to respective gas supply sources, not illustrated, via flow rate adjustment valves.

On the lower surface sides (i.e., the sides facing the rotation table 2) of the nozzles 31 to 33, 41, and 42, gas discharge holes 36 for discharging the above-described gases are formed at multiple locations, for example, with equal intervals along the radius direction of the rotation table 2. The gas discharge holes 36 are disposed such that the distance between the lower edges of the nozzles 31 to 35, 41, and 42 and the upper surface of the rotation table 2 is, for example, about 1 to 5 mm.

The area below the first process gas nozzle 31 is a first process area P1 in which a first process gas is caused to be adsorbed by the wafer W. The area below the second process gas nozzle 32 is a second process area P2 for supplying a second process gas, capable of generating a reaction product by reacting with the first process gas, to the wafer W. The area below the plasma process gas nozzle 33 is a third process area P3 for performing a modifying process of a film on the wafer W. The separation gas nozzle 42 is provided to form a separation area D for separating the first process area P1 and the second process area P2. The separation gas nozzle 41 is provided to form a separation area D for separating the third process area P3 and the first process area P1. No separation area D is provided between the second process area P2 and the third process area P3. This is because some of the components included in mixed gas supplied in the third process area P3 are often the same as the components of the second process gas supplied in the second process area P2, and therefore, it is not particularly necessary to separate the second process area P2 and the third process area P3 by using separation gas.

The first process gas nozzle 31 supplies, as the first process gas, a source gas constituting a main component of a film to be deposited. For example, in a case where the film to be deposited is a silicon oxide film ($SiO_2$), the first process gas nozzle 31 supplies silicon-containing gas such as organic aminosilane gas. The second process gas nozzle 32 supplies, as the second process gas, a reaction gas capable of generating a reaction product by reacting with the source gas. For example, in a case where the film to be deposited is a silicon oxide film ($SiO_2$), the second process gas nozzle 32 supplies an oxidizing gas such as oxygen gas, ozone gas, and the like. The plasma process gas nozzle 33 supplies a mixed gas including a noble gas and any one of the oxidizing gases in order to perform a modifying process of the film to be deposited, similar to the second process gas.

Figure 3:
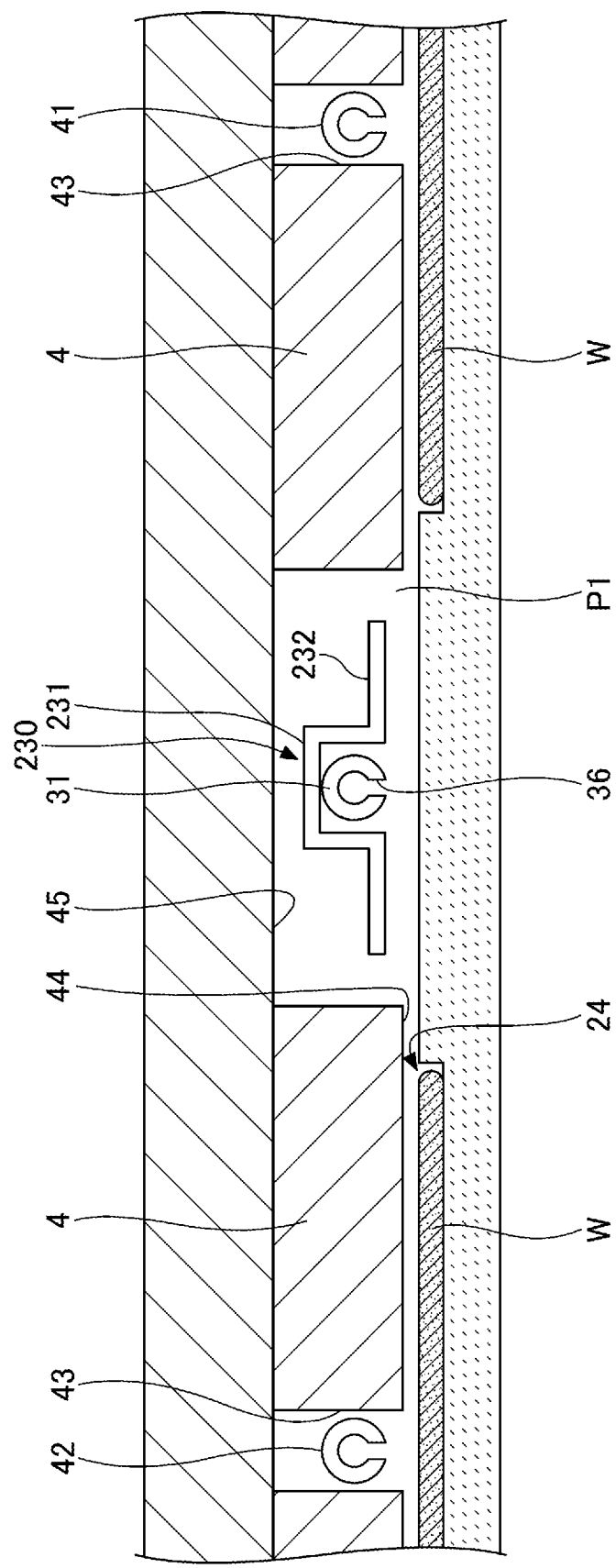
FIG. 3 illustrates a cross-sectional view taken along a concentric circle of a rotation table of a plasma process apparatus according to the first embodiment of the present disclosure.

FIG. 3 illustrates a cross-sectional view taken along a concentric circle of the rotation table of the plasma process apparatus according to the present embodiment. FIG. 3 is a cross-sectional view taken from the separation area D through the first process area P1 to the separation area D.

On the top panel 11 of the vacuum container 1, protruding portions 4 in a substantially circular sector shape are provided in the separation areas D. The protruding portions 4 are attached to the back surface of the top panel 11. Accordingly, a ceiling surface 44 (a first ceiling surface) and a ceiling surface 45 (a second ceiling surface) are formed in the vacuum container 1. The ceiling surface 44 is flat and low, and constitutes the lower surfaces of the protruding portions 4. The ceiling surface 45 is situated on either side in the circumferential direction of the ceiling surface 44 and is higher than the ceiling surface 44.

As illustrated in FIG. 2, each of the protruding portions 4 constituting the ceiling surface 44 has a circular sector shape of which the central vertex portion is cut into an arc shape in a plan view. At the centers in the circumferential direction of the protruding portions 4, groove portions 43 are formed to extend in the radius direction. The separation gas nozzles 41 and 42 are accommodated in the respective groove portions 43. The peripheral portions of the protruding portions 4 (portions on the outer edge side of the vacuum container 1) are bent in an L shape so as to face the outer end surface of the rotation table 2 and to be slightly spaced apart from the container main body 12, in order to prevent process gases from mixing with each other.

A nozzle cover 230 is provided above the first process gas nozzle 31 to pass the first process gas along the wafer W and to pass the separation gas on the side of the top panel 11 of the vacuum container 1 away from the wafer W. As illustrated in FIG. 3, the nozzle cover 230 includes a cover body 231 in an approximately box shape of which the lower surface side is open in order to accommodate the first process gas nozzle 31; and rectifier plates 232 formed as plate-shaped bodies that are connected to the upstream side and the downstream side, in the rotation direction of the rotation table 2, of the opening ends on the lower surface side of the cover body 231. The sidewall surface of the cover body 231 on the side closer to the rotation center of the rotation table 2 extends toward the rotation table 2 so as to face the tip portion of the first process gas nozzle 31. The sidewall surface of the cover body 231 on the outer edge side of the rotation table 2 is formed with a notch so as not to interfere with the first process gas nozzle 31.

As illustrated in FIG. 2, above the plasma process gas nozzle 33, a plasma generation apparatus 80 is provided to produce plasma in the plasma process gas discharged into the vacuum container 1.

Figure 4:
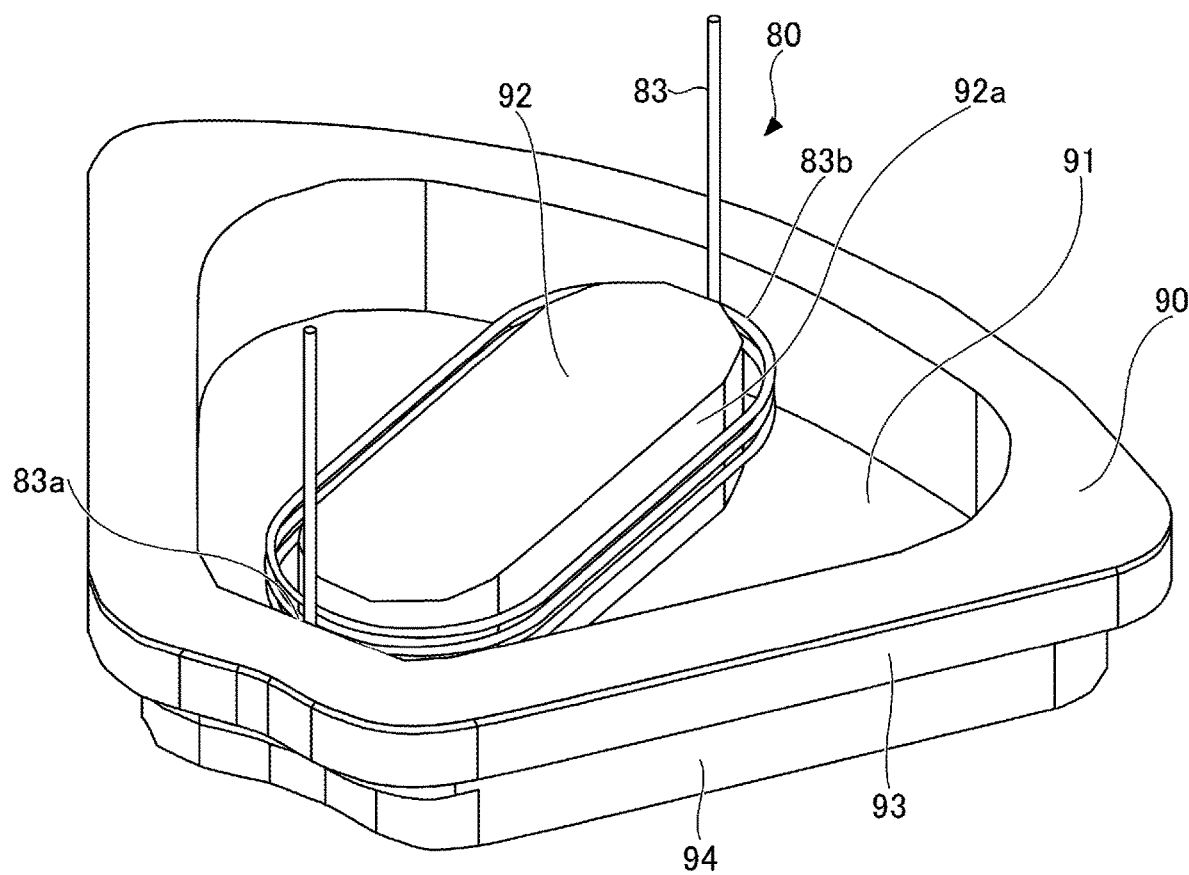
FIG. 4 is a drawing illustrating a main portion of a plasma generation apparatus according to the first embodiment of the present disclosure.

FIG. 4 is a drawing illustrating a main portion of the plasma generation apparatus 80. As illustrated in FIG. 4, the plasma generation apparatus 80 includes a coil 83 and a housing 90.

The housing 90 is provided to be fitted in the top panel 11 of the vacuum container 1 so as to constitute a portion of the upper surface of the vacuum container 1. The housing 90 is formed with a recess 91. A protruding portion 92 is formed to protrude from a bottom surface 91a of the recess 91. The inside of the protruding portion 92 is hollow to constitute a plasma generation chamber.

The protruding portion 92 is in an elongated shape extending in one direction. For example, the protruding portion 92 may be configured in an elongated polygonal shape. In FIG. 4, the protruding portion 92 is configured as a dodecagonal shape, but the protruding portion 92 may be configured in various shapes so long as the protruding portion 92 is in a polygonal shape having four or more vertices. In addition to polygons, the protruding portion 92 may be configured such that both ends of the protruding portion 92 are in an arc shape such as a semicircle.

The housing 90 includes a flange portion 93 and a downward protruding portion 94. The step between the flange portion 93 and the downward protruding portion 94 functions as a coupling section when the housing 90 is fitted in the top panel 11 of the vacuum container 1.

The housing 90 may be constituted by various materials, and may be constituted by, for example, quartz. Because the top panel 11 of the vacuum container 1 is also constituted by quartz, the housing 90 constituting a portion of the top panel 11 is preferably constituted by quartz.

The coil 83 functions as an electromagnetic field generation unit configured to generate an electromagnetic field when an alternating current power is supplied to the coil 83. The coil 83 is wound alongside side surfaces 92a of the protruding portion 92. The coil 83 may be wound around the protruding portion 92 with any number of turns as necessary, and for example, as illustrated in FIG. 4, the coil 83 may be wound with three turns. Both ends 83a and 83b of the coil 83 in the longitudinal direction are suspended from above.

As illustrated in FIGS. 1 and 2, the coil 83 is connected via a matching device 84 to a radio frequency power source 85 of which the frequency is, for example, 13.56 MHz and of which the output power is, for example, 5000 W. The coil 83 is provided to be hermetically partitioned from the inner area of the vacuum container 1. In FIG. 1 and FIG. 2, connection electrodes 86 are provided to electrically connect the coil 83, the matching device 84, and the radio frequency power source 85.

In FIG. 4, the end portion 83a of the coil 83 that is closer to the vertex of the circular sector of the housing 90 is situated closer to the rotation center of the rotation table 2, and the end portion 83b that is on the opposite side from the end portion 83a is situated closer to the outer circumference of the rotation table 2. A portion of the coil 83 wound alongside the side surfaces of the protruding portion 92 and extending in the longitudinal direction of the protruding portion 92 is provided to completely cover the entire diameter of the recessed portion 24.

Although the details are explained later, the end portions 83a and 83b of the coil 83 are connected to an elevating mechanism such that each of the end portions 83a and 83b can be individually moved upward and downward. Accordingly, the coil 83 can be inclined in the radius direction of the rotation table 2 so as to correct the imbalance, i.e., the amount of the plasma process on the inner position closer to the rotation center of the rotation table 2 being higher than the amount of the plasma process on the outer position closer to the outer circumferential side of the rotation table 2 due to a difference in the distance of the track between the inner and outer positions of the rotation table 2 in a case where the coil 83 is installed horizontally.

Specifically, the end portion 83a on the side closer to the rotation center is raised such that the distance between the end portion 83a and the rotation table 2 becomes greater than the distance between the end portion 83b and the rotation table 2, and accordingly, by reducing the amount of the plasma process on the inner position, the imbalance in the amount of the plasma process between the inner position and the outer position of the rotation table 2 can be corrected.

Figure 5:
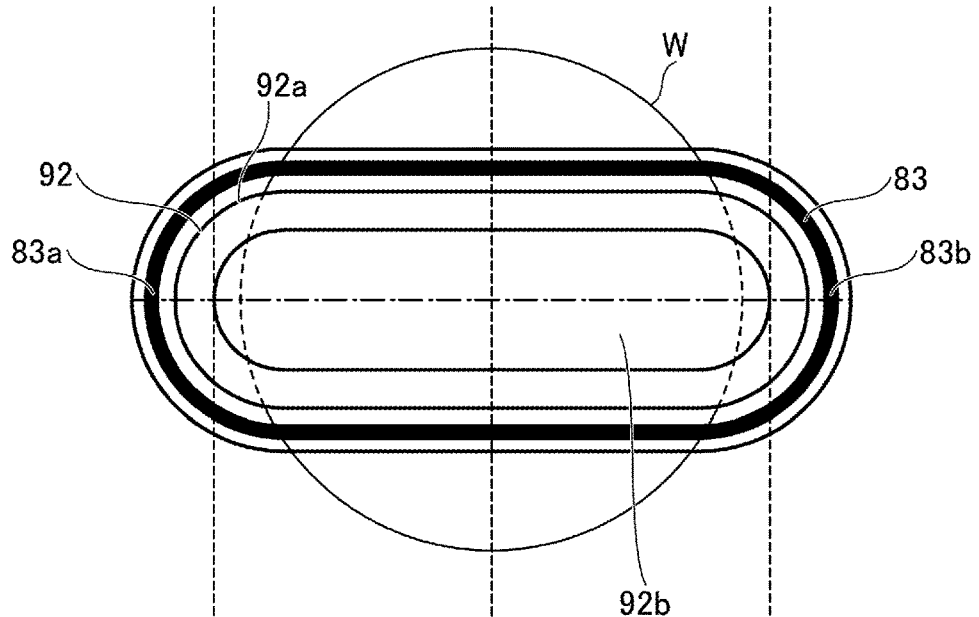
FIG. 5 is a cross-sectional view illustrating an example of the plasma generation apparatus according to the first embodiment of the present disclosure.
Figure 5:
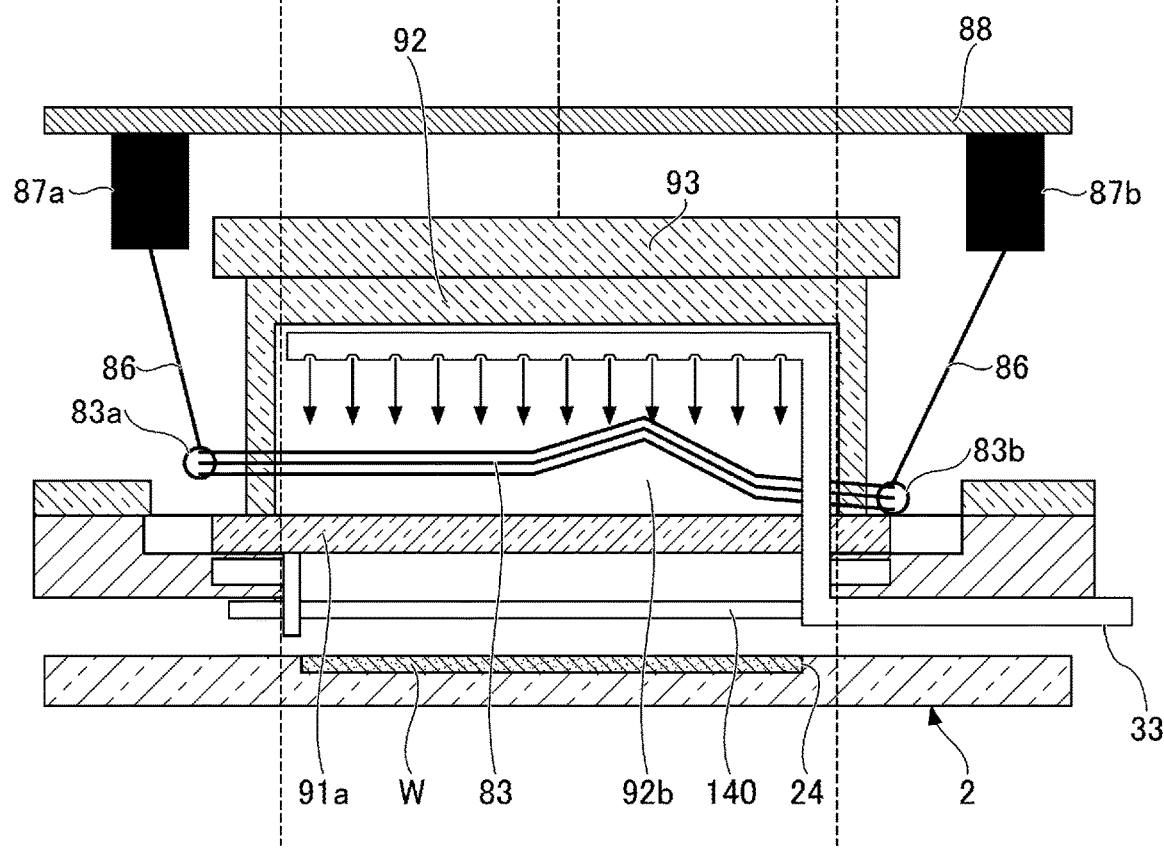

FIG. 5 is a cross-sectional view illustrating an example of the plasma generation apparatus 80 according to the first embodiment of the present disclosure. In FIG. 5, (a) is a plan view illustrating the plasma generation apparatus 80 according to the present embodiment, and (b) is a cross-sectional side view illustrating the plasma generation apparatus 80 according to the first embodiment of the present disclosure.

As illustrated in FIG. 5, the coil 83 is configured to have a length capable of covering the diameter of the wafer W. Therefore, in the longitudinal direction of the protruding portion 92 of the housing 90, the side surface 92a of the protruding portion 92 is longer than the diameter of the wafer W.

As illustrated in (b) of FIG. 5, the inside of the protruding portion 92 constitutes a plasma generation chamber 92b. Because the plasma process chamber 92b is very close in position to the coil 83, a plasma or radical can efficiently be produced in the supplied plasma process gas. As illustrated in (b) of FIG. 5, the plasma process gas is supplied downward from the plasma process gas nozzle 33 disposed in proximity to the ceiling surface of the plasma generation chamber 92b, and the plasma process gas is activated by the coil 83.

In this case, the both ends 83a and 83b of the coil 83 are connected via the connection electrodes 86 to the elevating mechanisms 87a and 87b, respectively. The elevating mechanisms 87a and 87b are provided independently from each other. For example, the elevating mechanisms 87a and 87b include motors, and can move the end portions 83a and 83b of the coil 83 upward and downward, and can incline the coil 83. For example, the elevating mechanisms 87a and 87b are supported by the support member 88.

Alternatively, the elevating mechanisms 87a and 87b may be configured integrally. The elevating mechanisms 87a and 87b may have various configurations, so long as the elevating mechanisms 87a and 87b can independently move the end portions 83a and 83b of the coil 83 upward and downward.

In the vacuum container 1, an ion trap plate 140 may be provided as necessary to reduce the amount of ions generated in the plasma generation chamber 92b. The ion trap plate 140 is also provided to correct the imbalance in the amount of the plasma process between the inner position and the outer position of the rotation table 2, and the amount of ions reaching the wafer W is adjusted by covering a larger area on the inner position of the rotation table 2. The ion trap plate 140 is not mandatory, and may be provided as necessary.

Figure 6:
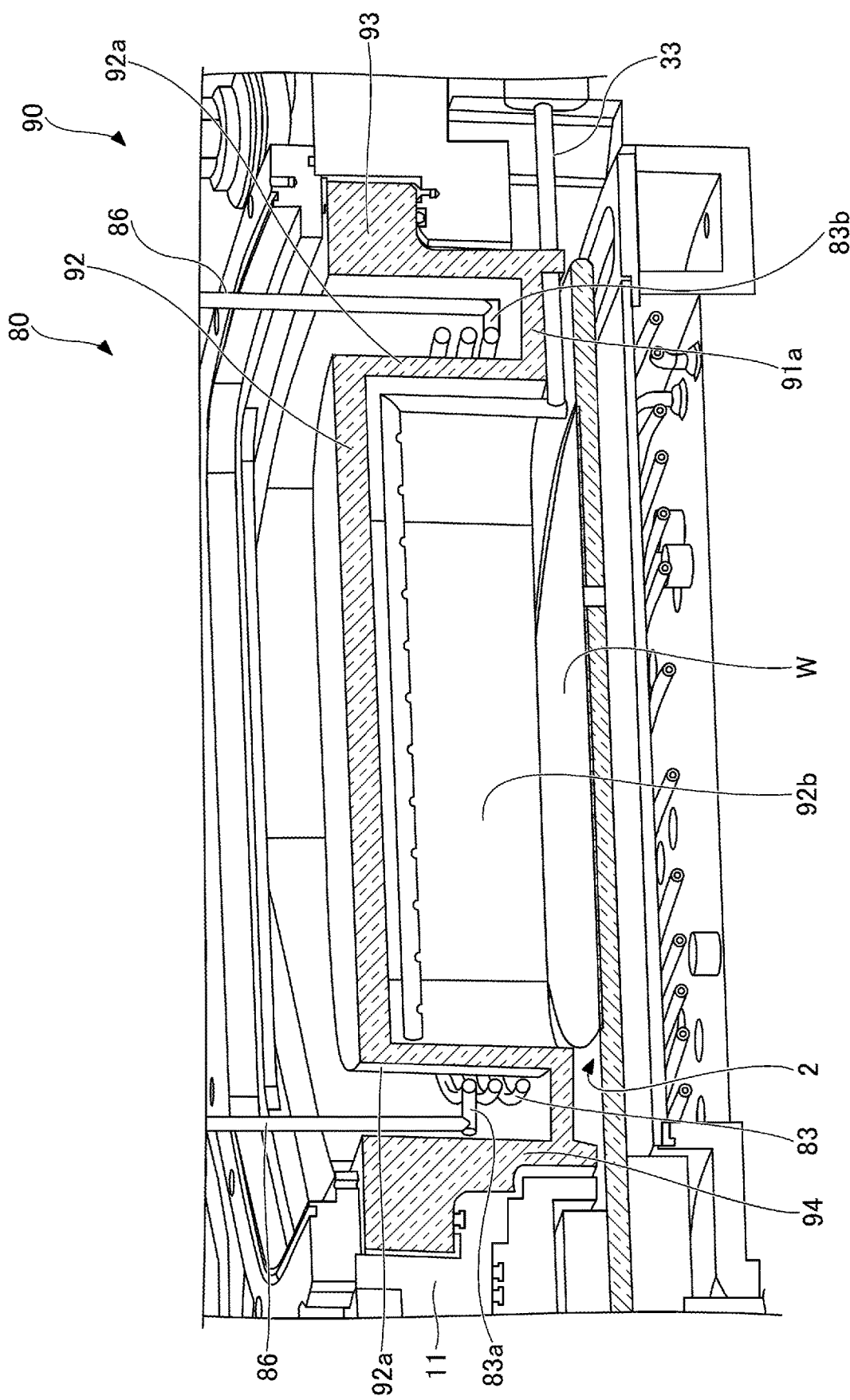
FIG. 6 is a drawing illustrating a protruding portion of a housing and the like of the plasma generation apparatus according to the first embodiment of the present disclosure.

FIG. 6 is an enlarged drawing illustrating the protruding portion 92 of the housing 90 and the like of the plasma generation apparatus 80 according to the first embodiment of the present disclosure. As illustrated in FIG. 6, the flange portion 93 of the housing 90 is fitted in the opening portion of the top panel 11 of the vacuum container 1. In the downward protruding portion 94, the plasma process area P3 for performing a plasma process is formed. The bottom surface of the plasma generation chamber 92b in the protruding portion 92 of the housing 90 is open to allow the plasma process gas supplied from the plasma process gas nozzle 33 to be supplied to the wafer W. In this case, the coil 83 is wound around a lower portion of the side surface 92a of the protruding portion 92, and when an alternating current power is supplied to the coil 83, the coil generates electromagnetic waves. With the generated electromagnetic wave energy, plasma (ions) or radicals are produced in the plasma process gas.

Then, the plasma process gas in the plasma state is supplied to the wafer W to reform the film on the wafer W.

The end portion 83a of the coil 83 on the side closer to the rotation center of the rotation table 2 and the end portion 83b of the coil 83 on the side closer to the outer circumference of the rotation table 2 are configured to be movable upward and downward via the connection electrode 86. The amount of the plasma process can be adjusted by inclining the coil 83. Specifically, for example, the end portion 83a of the coil 83 on the side closer to the rotation center of the rotation table 2 is increased so as to reduce the amount of the plasma process on the side closer to the rotation center of the rotation table 2, so that the amounts of the plasma process are uniformized between the inner position and the outer position of the rotation table 2.

The distances by which the end portions 83a and 83b are moved upward and downward can be set to various values, and the end portions 83a and 83b may be configured to be moved upward and downward by, for example, 150 to 200 mm.

As illustrated in FIG. 6, in the plasma generation apparatus 80, a Faraday shield is not provided. Conventionally, a Faraday shield is provided between the coil 83 and the bottom surface 91a of the housing 90 to cut off the electric field component and supply only the magnetic field component to the wafer W. However, because the Faraday shield is made of metal, there occurs a problem in that the Faraday shield cannot be used for a high-temperature process of 650° C. or higher.

In the plasma generation apparatus 80 according to the present embodiment, the Faraday shield made of metal is not used, and the main portion of the plasma generation apparatus is constituted by only components made of quartz with a high heat resistance. Accordingly, a high-temperature process can be supported.

In this manner, the plasma generation apparatus and the deposition apparatus according to the first embodiment can adjust and uniformize the amount of the plasma process in the radius direction while supporting a high-temperature process.

Other constituent elements of the plasma process apparatus according to the present embodiment are explained again.

As illustrated in FIG. 2, on the outer circumferential side of the rotation table 2, a side ring 100 that is a cover body is provided at a position slightly lower than the rotation table 2. In the upper surface of the side ring 100, for example, discharge ports 61 and 62 are formed at two positions so as to be spaced apart from each other in the circumferential direction. In other words, in the floor surface of the vacuum container 1, two discharge ports are formed, and the discharge ports 61 and 62 are formed in the side ring 100 at positions corresponding to these discharge ports.

In the present embodiment, the discharge ports 61 and 62 are referred to as a first discharge port 61 and a second discharge port 62, respectively. In this case, the first discharge port 61 is formed at a position between the first process gas nozzle 31 and the separation area D that is situated on the downstream side with reference to the first process gas nozzle 31 in the rotation direction of the rotation table 2, the first discharge port 61 being disposed closer to the separation area D than to the first process gas nozzle 31. Also, the second discharge port 62 is formed at a position between the plasma generation apparatus 80 and the separation area D that is situated on the downstream side with reference to the plasma generation apparatus 80 in the rotation direction of the rotation table 2, the second discharge port 62 being disposed closer to the separation area D than to the plasma generation apparatus 80.

The first discharge port 61 discharges the first process gas and the separation gas. The second discharge port 62 discharges the plasma process gas and the separation gas. Each of the first discharge port 61 and the second discharge port 62 is connected to, for example, a vacuum pump 64 that is a vacuum discharge mechanism, through a discharge tube 63 in which a pressure adjustment unit 65 such as a butterfly valve and the like is interposed.

As described above, the housing 90 is provided to extend from the central area C to the outer edge side. Accordingly, the gas flow of the gas flowing to the discharge port 62 from the upstream side with reference to the process area P2 in the rotation direction of the rotation table 2 may be restricted by the housing 90. Therefore, on the upper surface of the side ring 100, a gas flow path 101 in a groove shape for passing gas is formed on the outer circumferential side with reference to the housing 90.

As illustrated in FIG. 1, at the central portion on the lower surface of the top panel 11, a protruding portion 5 is formed in a substantially ring shape in the circumferential direction so as to be continuous to portions of the protruding portions 4 on the side of the central area C, the lower surface of the protruding portion 5 being at the same height as the lower surface (the ceiling surface 44) of the protruding portion 4. On a side closer to the rotation center of the rotation table 2 with reference to the protruding portion 5, a labyrinth structure 110 is provided above the core portion 21 so as to inhibit mixing of different process gases in the central area C.

As described above, the housing 90 is formed up to a position close to the central area C, and accordingly, the core portion 21 supporting the central portion of the rotation table 2 is formed such that the portion of the core portion 21 above the rotation table 2 is formed on the side closer to the rotation center so as to avoid the housing 90. For this reason, different gases are more likely to be mixed in the central area C than in the outer edge area. Therefore, the labyrinth structure 110 is provided above the core portion 21 so as to block the flow path of the gases and to inhibit mixing of different process gases in the central area C.

As illustrated in FIG. 1, in a space between the rotation table 2 and the bottom surface portion 14 of the vacuum container 1, a heater unit 7 that is a heating mechanism is provided. The heater unit 7 is configured to be able to heat, via the rotation table 2, the wafer W on the rotation table 2 to, for example, a temperature between room temperature and about 300° C. As illustrated in FIG. 1, a cover member 71a is provided on an outer side of the heater unit 7, and a cover member 7a is provided to cover the heater unit 7 from above the heater unit 7. In the bottom surface portion 14 of the vacuum container 1, purge gas supply tubes 73 are provided at multiple locations along the circumferential direction so as to purge, on the lower side of the heater unit 7, the space in which the heater unit 7 is provided.

As illustrated in FIG. 2, on the sidewall of the vacuum container 1, a conveying port 15 is formed to pass the wafer W between a conveying arm 10 and the rotation table 2. This conveying port 15 is configured to be hermetically closed by a gate valve G.

At the recessed portion 24 of the rotation table 2 that faces the conveying port 15, the wafer W is passed from and to the conveying arm 10. Therefore, below the rotation table 2, lifting pins and an elevating mechanism, not illustrated, penetrating the recessed portion 24 and configured to lift the wafer W from the back side are provided at the position corresponding to the recessed portion 24 of the rotation table 2 that faces the conveying port 15.

Furthermore, the plasma process apparatus according to the present embodiment includes a control unit 120 constituted by a computer configured to control overall operations of the apparatus. The control unit 120 includes a processing circuitry and a memory that stores a program for executing a substrate process explained later. The program includes instructions executed by the processing circuitry to cause the plasma process apparatus to perform various operations. The program is installed to the memory of the control unit 120 from a storage unit 121 that includes a storage medium such as a hard disk, a compact disk, a magneto-optical disk, a memory card, a flexible disk, or the like.

Although the plasma process apparatus is applied to, for example, the deposition apparatus in the present embodiment, the plasma process apparatus according to the present embodiment may also be applied to a substrate process apparatus that performs a substrate process other than the deposition, such as an etching apparatus or the like. Although the rotation table 2 is configured as, for example, a rotatable rotation table, the plasma process apparatus and the plasma generation apparatus according to the present embodiment can be applied to various substrate process apparatuses that are desired to be able to adjust the plasma strength, and therefore, the rotation of the rotation table 2 it not always necessary.

[Deposition Method]

A deposition method using the deposition apparatus according to the first embodiment of the present disclosure is explained.

First, according to a process, the coil 83 is set to a predetermined inclination. For example, with respect to the inclination angle of the coil 83, the shape of the coil 83 may be designated by the recipe, or the control unit 120 may make a determination from the content of recipe and set the coil 83 to a predetermined inclination angle. The inclination angle of the coil 83 may be automatically set by upward-and-downward moving mechanism 87a and 87b or may be manually set by an operator through operations.

In the deposition method using the deposition apparatus according to the first embodiment of the present disclosure, first, the wafer W is conveyed into the vacuum container 1. When a substrate such as the wafer W is conveyed, first, the gate valve G is opened. Then, while the rotation table 2 is rotated with regular intervals, the conveying arm 10 conveys and places the wafer W onto the rotation table 2 through the conveying port 15.

Subsequently, the gate valve G is closed. While the inside of the vacuum container 1 is maintained at a predetermined pressure with the vacuum pump 64 and the pressure adjustment unit 65, the heater unit 7 heats the wafer W to a predetermined temperature while rotating the rotation table 2. At this occasion, the separation gas nozzles 41 and 42 supply a separation gas, for example, argon gas.

Subsequently, the first process gas nozzle supplies the first process gas, and the second process gas nozzle 32 supplies the second process gas. Also, the plasma process gas nozzle 33 supplies plasma process gas at a predetermined flow rate.

In this case, depending on the purpose, various gases may be used as the first process gas, the second process gas, and the plasma process gas. The first process gas nozzle 31 supplies a source gas. The second process gas nozzle 32 supplies an oxidizing gas or a nitriding gas. The plasma process gas nozzle 33 supplies an oxidizing gas or a nitriding gas similar to the oxidizing gas or the nitriding gas supplied from the second process gas nozzle and a plasma process gas constituted by a mixed gas including noble gas.

In the following explanation, for example, it is assumed that the film to be deposited is a silicon oxide film, the first process gas is an organic aminosilane gas, the second process gas is an oxygen gas, and the plasma process gas is a mixed gas of argon and oxygen.

On the surface of the wafer W, according to the rotation of the rotation table 2, silicon-containing gas or metal-containing gas is adsorbed to the wafer W in the first process area P1, and subsequently, the silicon-containing gas adsorbed by the wafer W is oxidized by the oxygen gas in the second process area P2. As a result, one or more molecular layers of a silicon oxide film that is a thin film component, and a reaction product is formed.

Further, when the wafer W reaches the plasma process area P3 as the rotation table 2 rotates, a modifying process of the silicon oxide film is performed with a plasma process.

Because the inclination of the coil 83 of the plasma generation apparatus 80 is set so as to perform the plasma process with a high in-plane uniformity, the plasma process can be performed with the high in-plane uniformity. Because of the adjustment of the inclination of the coil 83 and because of the above-described nozzles 33 to 35, the deposition can be performed with an extremely high in-plane uniformity. Specifically, the improvement of the in-plane uniformity due to deformation of the coil 83 and the in-plane uniformity due to setting of the amount of supply of the plasma gas in each area can be combined, and more appropriate adjustment can be performed.

Furthermore, even in a case where multiple nozzles are used, the inclination of the coil 83 for increasing the in-plane uniformity is set according to the inclination of the coil 38, and therefore, a plasma process with a high in-plane uniformity can still be performed.

When a plasma process is performed in the plasma process area P3, the plasma generation apparatus 80 supplies a radio frequency power of a predetermined output to the coil 83.

In the present embodiment, the rotation table 2 continues to be rotated, and accordingly, adsorbing of the source gas by the surface of the wafer W, oxidizing of the source gas component adsorbed by the surface of the wafer W, and plasma modifying of the reaction product are performed in this order multiple times. Specifically, a deposition process by an atomic layer deposition (ALD) and a modifying process of the formed film are performed multiple times according to the rotation of the rotation table 2.

The separation areas D are provided, along the circumferential direction of the rotation table 2, between the first and second process areas P1 and P2 and between the third and first process areas P3 and P1 in the plasma process apparatus according to the present embodiment. Therefore, in the separation areas D, while mixing of the process gas and the plasma process gas is inhibited, the gases are discharged to the discharge ports 61 and 62.

Examples of the first process gas according to the present embodiment include silicon-containing gases including diisopropylaminosilane (DIPAS), trisdimethylaminosilane (3DMAS), bis-tertiary-butylaminosilane (BTBAS), dichlorosilane (DCS), hexachlorodisilane (HCD), and the like.

In a case where the deposition method using the deposition apparatus according to the first embodiment of the present disclosure is applied to deposition of a TiN film, the first process gas may be a metal-containing gas including titanium tetrachloride (TiCl$_4$), titanium methyl pentane dionate bis tetramethyl heptane dionate (Ti(MPD) (THD)), trimethylaluminum (TMA), tetrakis ethylmethylamino zirconium (TEMAZ), tetrakis ethylmethylamino hafnium (TEMHF), strontium bis tetramethyl heptane dionate (Sr (THD)$_2$), or the like.

In the present embodiment, there has been described an example in which as the plasma-processing gas, the argon gas is used as the noble gas, and the noble gas is combined with the modifying oxygen gas. However, it is also possible to use other noble gases. Instead of the oxygen gas, an ozone gas or water may be used.

In the process of forming a nitride film, an NH$_3$ gas or an N$_2$ gas may be used for a modification purpose. Furthermore, if necessary, a mixed gas with a hydrogen-containing gas (a H$_2$ gas or an NH$_3$ gas) may be used.

As the separation gas, in addition to the argon gas, it may be possible to use a nitrogen gas or the like.

Although the flow rate of the first process gas in the deposition process is not limited, it may be set to, for example, 50 to 1,000 sccm.

The flow rate of the oxygen-containing gas included in the plasma-processing gas is not limited and may be, for example, about 500 to 5,000 sccm (as an example, 500 sccm).

The internal pressure of the vacuum container 1 is not limited and may be set to, for example, about 0.5 to 4 Torr (as an example, 1.8 Torr).

The temperature of the wafer W is not limited and may be, for example, about 40° C. to 750° C. In particular, the deposition method according to the present embodiment is effective for a high-temperature process, and can be applied to a process of 650° C. or higher.

The rotational speed of the rotation table 2 is not limited, and may be, for example, about 60 rpm to 300 rpm.

In this manner, according to the deposition method using the deposition apparatus according to the first embodiment of the present disclosure, the coil 83 is inclined to improve the in-plane uniformity of the plasma process, and therefore, a plasma process can be performed with a high in-plane uniformity.

[Plasma Generation Apparatus According to Second Embodiment]

Figure 7:
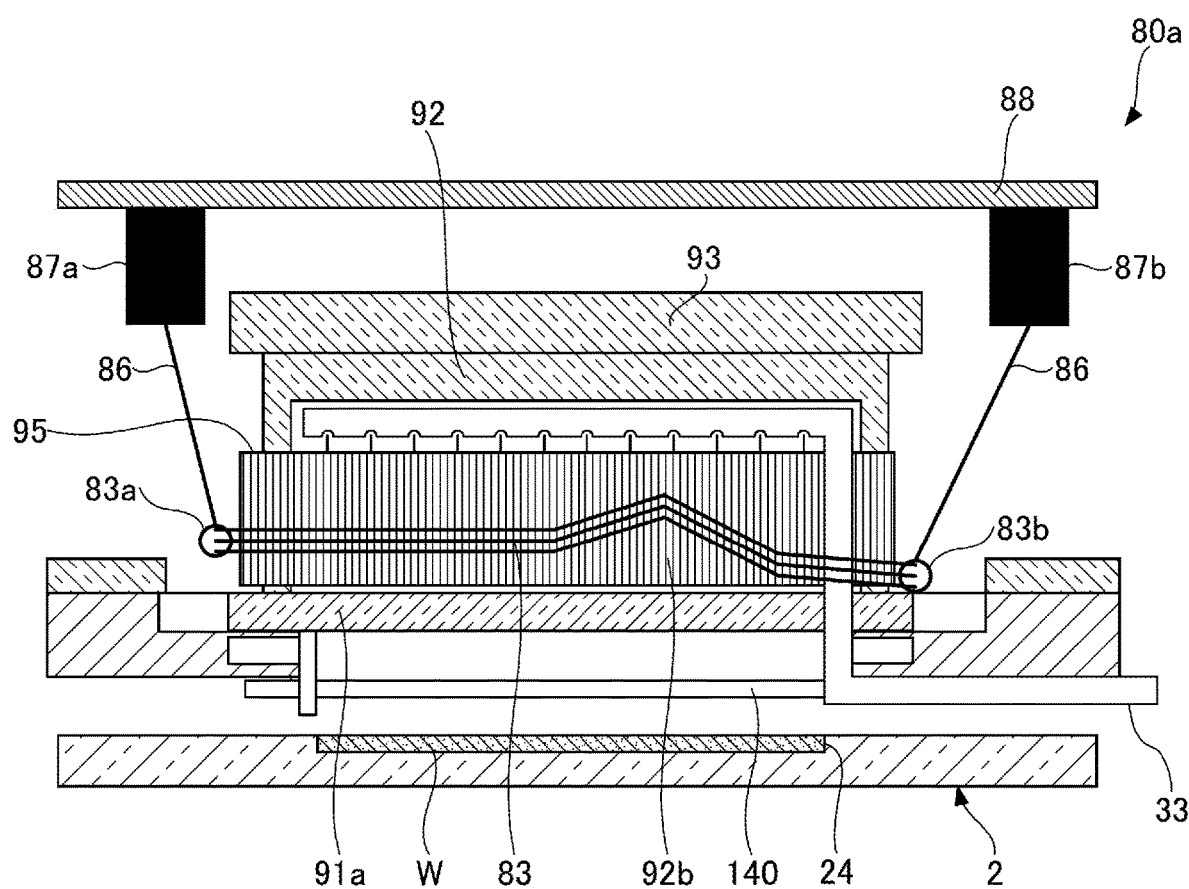
FIG. 7 is a drawing illustrating a plasma generation apparatus according to a second embodiment of the present disclosure.

FIG. 7 is a drawing illustrating a plasma generation apparatus 80*a* according to the second embodiment of the present disclosure. The plasma generation apparatus 80*a* is different from the plasma generation apparatus 80*a* according to the first embodiment of the present disclosure in that the plasma generation apparatus 80*a* includes a Faraday shield 95 made of quartz.

The Faraday shield 95 has a slit configured to block an electric field and pass only a magnetic field. A Faraday shield made of metal cannot support a high-temperature process of 650° C. or higher, and therefore, the Faraday shield 95 made of quartz is provided.

Therefore, a plasma process can be performed by using only the magnetic field while supporting a high-temperature process, and the amount of the plasma process can be uniformized between the inner position and the outer position of the rotation table 2 by adjusting the inclination angle of the coil 83.

The configurations and processes other than the above are substantially the same as those of the first embodiment, and accordingly, explanation thereabout is omitted.

For example, although the plasma generation apparatus has been applied to the rotation table-type deposition apparatus in the above explanation about the first and second embodiments, the plasma generation apparatus according to the present disclosure can also be applied to a single-wafer deposition apparatus.

According to the present disclosure, a high-temperature process can be supported and an inclination of a coil can be adjusted.

Although preferred embodiments and examples of the present disclosure have been explained in detail, the present disclosure is not limited by the above-described embodiments and examples, and various modifications and replacements can be applied to the above-described embodiments and examples without departing from the subject matter described in the claims.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:

1. A plasma generation apparatus comprising:
a housing fitted in a portion of an upper surface of a process chamber of a deposition apparatus and including a protruding portion having an elongated shape in a plan view of the plasma generation apparatus and protruding upward from a bottom surface, the housing having a first side and a second side facing the first side, the second side of the housing longer than the first side of the housing;
a coil wound around the protruding portion and having an elongated shape in the plan view; and
an inclination adjustment mechanism configured to move a first end and a second end of the coil in a longitudinal direction independently of each other upward and downward to change an inclination of the coil in the longitudinal direction, the first end of the coil being disposed adjacent to the first side of the housing, and the second end of the coil being disposed adjacent to the second side of the housing.

2. The plasma generation apparatus according to claim 1, wherein a plasma generation space in which plasma is generated is formed below the protruding portion.

3. The plasma generation apparatus according to claim 1, wherein the housing is constituted by quartz.

4. The plasma generation apparatus according to claim 1, wherein the inclination adjustment mechanism suspends and supports the first end and the second end of the coil.

5. The plasma generation apparatus according to claim 1, wherein the elongated shape in the plan view of the protruding portion is a polygonal shape.

6. The plasma generation apparatus according to claim 1, wherein the housing is in a shape of a circular sector, and the protruding portion extends in a radius direction at a center of the circular sector.

7. The plasma generation apparatus according to claim 1, wherein
the housing includes a flange portion fitted in the portion of the upper surface of the process chamber, the protruding portion being disposed inside the flange portion, and
the inclination adjustment mechanism is connected to the coil between the protruding portion and the flange portion.

8. A deposition apparatus comprising:
a process chamber;
a rotation table provided in the process chamber;
a protruding portion having an elongated shape in a plan view of the deposition apparatus extending, in a portion of an upper surface of the process chamber, along a radius of the rotation table, the protruding portion protruding upward from the upper surface;
a coil wound around the protruding portion and having an elongated shape in the plan view; and
an inclination adjustment mechanism configured to move a first end and a second end of the coil in a longitudinal direction independently of each other upward and downward to change an inclination of the coil in the longitudinal direction, the first end of the coil being disposed adjacent to a center side of the rotation table, and the second end of the coil being disposed adjacent to an outer circumferential side of the rotation table.

9. The deposition apparatus according to claim 8, wherein a plasma generation space in which plasma is generated is formed below the protruding portion.

10. The deposition apparatus according to claim 8, wherein a plurality of substrate-receiving areas arranged along a circumferential direction are disposed on an upper surface of the rotation table, and
the coil is disposed to be longer than a diameter of the substrate-receiving area to cover an entirety in a longitudinal direction of the substrate-receiving area.

11. The deposition apparatus according to claim 8, wherein the upper surface is constituted by quartz.

12. The deposition apparatus according to claim 8, wherein the inclination adjustment mechanism suspends and supports the first end and the second end of the coil.

13. The deposition apparatus according to claim 8, wherein the elongated shape in the plan view of the protruding portion is a polygonal shape.

14. The deposition apparatus according to claim 8, wherein the protruding portion is formed on a bottom surface of a housing fitted in a portion of the upper surface of the process chamber.

15. The deposition apparatus according to claim 14, wherein the bottom surface of the housing is formed to be lower than the upper surface of the process chamber.

16. The deposition apparatus according to claim 8, further comprising
a housing including a flange portion fitted in the portion of the upper surface of the process chamber, wherein
the protruding portion is formed on a bottom surface of the housing, the protruding portion being disposed inside the flange portion, and
the inclination adjustment mechanism is connected to the coil between the protruding portion and the flange portion.

* * * * *